(12) United States Patent
Jung et al.

(10) Patent No.: US 10,840,465 B2
(45) Date of Patent: Nov. 17, 2020

(54) PRODUCING METHOD OF RADIATION DETECTION ELEMENT AND RADIATION DETECTION ELEMENT

(71) Applicant: KABUSHIKI KAISHA TOSHIBA, Minato-ku (JP)

(72) Inventors: Hyangmi Jung, Yokohama (JP); Satomi Taguchi, Nagoya (JP); Isao Takasu, Setagaya (JP); Yuko Nomura, Kawasaki (JP); Rei Hasegawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/292,369

(22) Filed: Mar. 5, 2019

(65) Prior Publication Data

US 2020/0035934 A1 Jan. 30, 2020

(30) Foreign Application Priority Data

Jul. 26, 2018 (JP) .................................. 2018-140379

(51) Int. Cl.
*H01L 21/00* (2006.01)
*H01L 51/44* (2006.01)
*H01L 51/00* (2006.01)
*H01L 51/42* (2006.01)
*H01L 51/50* (2006.01)

(52) U.S. Cl.
CPC .......... *H01L 51/44* (2013.01); *H01L 51/0026* (2013.01); *H01L 51/0037* (2013.01); *H01L 51/4206* (2013.01); *H01L 51/5056* (2013.01); *H01L 51/4273* (2013.01)

(58) Field of Classification Search
CPC ............ H01L 51/0026; H01L 51/4206; H01L 51/524
See application file for complete search history.

(56) References Cited

U.S. PATENT DOCUMENTS 10,333,067 B2 * 6/2019 Sassa ...................... H01L 51/56
2007/0082140 A1 * 4/2007 Suzuki ................ H01L 51/0036
427/402

(Continued)

FOREIGN PATENT DOCUMENTS

JP 2010-98034 4/2010
JP 2014-3282 1/2014

*Primary Examiner* — Laura M Menz
(74) *Attorney, Agent, or Firm* — Oblon, McClelland, Maier & Neustadt, L.L.P.

(57) ABSTRACT

According to an embodiment, a producing method of a radiation detection element, includes: forming an organic semiconductor layer by applying an organic semiconductor solution onto a first conductive layer formed on a support substrate; forming a second conductive layer on the organic semiconductor layer; sealing a laminated body of the first conductive layer, the organic semiconductor layer, and the second conductive layer, formed on the support substrate, with a sealing member; and applying heat to the laminated body sealed with the sealing member. In at least one of forming of the organic layer and forming of the second conductive layer, a forming environment of the organic semiconductor layer and the second conductive layer are adjusted such that the solvent content of the organic semiconductor layer is in a predetermined range.

9 Claims, 5 Drawing Sheets

(56) References Cited

U.S. PATENT DOCUMENTS

| | | | | |
|---|---|---|---|---|
| 2008/0048181 | A1* | 2/2008 | Tanaka | C07D 333/18 |
| | | | | 257/40 |
| 2008/0171403 | A1* | 7/2008 | Masumoto | C07D 495/22 |
| | | | | 438/99 |
| 2010/0093119 | A1* | 4/2010 | Shimizu | C08G 64/0208 |
| | | | | 438/29 |
| 2013/0333758 | A1* | 12/2013 | Okabe | C07F 9/5329 |
| | | | | 136/263 |
| 2014/0005399 | A1* | 1/2014 | Hatakeyama | H05B 33/14 |
| | | | | 546/13 |
| 2014/0158203 | A1* | 6/2014 | Etori | B82Y 40/00 |
| | | | | 136/263 |
| 2015/0318480 | A1* | 11/2015 | Ohara | H01L 51/0072 |
| | | | | 136/263 |
| 2017/0018724 | A1* | 1/2017 | Tsuyama | H01L 51/0071 |
| 2017/0338425 | A1* | 11/2017 | Tsuyama | H01L 51/0004 |
| 2018/0175298 | A1* | 6/2018 | Sassa | C08G 61/12 |
| 2018/0240977 | A1* | 8/2018 | Yamamoto | C08K 5/15 |
| 2019/0010276 | A1* | 1/2019 | Goto | C08G 61/125 |
| 2019/0074452 | A1* | 3/2019 | Tsuyama | H01L 51/0007 |
| 2020/0035934 | A1* | 1/2020 | Jung | H01L 51/4206 |
| 2020/0136061 | A1* | 4/2020 | Onodera | H01L 51/0074 |

\* cited by examiner

FIG.5

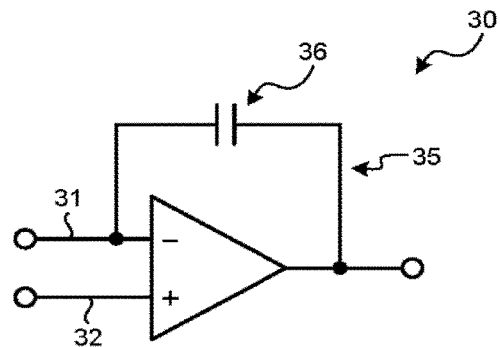

FIG.6

| | PRODUCING CONDITION | THICKNESS OF ORGANIC SEMICONDUCTOR LAYER [μm] | AMOUNT OF CONTAINED SOLVENT [WEIGHT%] |
|---|---|---|---|
| EXAMPLE 1 | 10 HOURS IN NORMAL TEMPERATURE → DEPOSITION → SEALING → HEAT TREATMENT AT 140°C | 25 | 0.562, 0.690 |
| EXAMPLE 2 | 8 HOURS IN NORMAL TEMPERATURE → VACUUM → DEPOSITION → SEALING → HEAT TREATMENT AT 140°C | 25 | 0.829 |
| EXAMPLE 3 | HEATING AT 60°C → DEPOSITION → SEALING → HEAT TREATMENT AT 140°C | 25 | 0.017 |
| EXAMPLE 4 | HEATING AT 60°C → DEPOSITION → SEALING → HEAT TREATMENT AT 140°C | 50 | 1.832 |
| EXAMPLE 5 | 4 HOURS IN 50°C → 10 HOURS IN NORMAL TEMPERATURE → 1.5 HOURS IN 45°C → DEPOSITION → SEALING → HEAT TREATMENT AT 140°C | 50 | 1.795, 1.095 |
| COMPARATIVE EXAMPLE 1 | 10 HOURS IN NORMAL TEMPERATURE → DEPOSITION → HEAT TREATMENT AT 140°C → SEALING | 25 | 0.005, 0.003 |
| COMPARATIVE EXAMPLE 2 | 10 HOURS IN NORMAL TEMPERATURE → DEPOSITION → SEALING → HEAT TREATMENT AT 140°C | 50 | 11.284 |

PRODUCING METHOD OF RADIATION DETECTION ELEMENT AND RADIATION DETECTION ELEMENT

CROSS-REFERENCE TO RELATED APPLICATIONS

This application is based upon and claims the benefit of priority from Japanese Patent Application No. 2018-140379, filed on Jul. 26, 2018; the entire contents of which are incorporated herein by reference.

FIELD

Embodiments described herein relate generally to a producing method of a radiation detection element, and a radiation detection element.

BACKGROUND

A radiation detection element having a configuration in which an organic semiconductor layer is interposed between a pair of conductive layers, is known. A method of forming an organic semiconductor layer by applying an organic semiconductor solution onto a conductive layer formed on a support substrate, and by drying the applied organic semiconductor solution, and of forming a conductive layer on the organic semiconductor layer, is known as a producing method of a radiation detection element. In addition, in order to remove a solvent contained in the organic semiconductor solution, a method of sufficiently heating the organic semiconductor layer or the conductive layer at the time of forming the organic semiconductor layer or forming the conductive layer on the organic semiconductor layer, is disclosed.

However, in the producing method of the related art, a detection sensitivity of the radiation detection element decreases due to the influence of a dark current of the radiation detection element.

BRIEF DESCRIPTION OF THE DRAWINGS

FIG. 5 is a circuit diagram of a detection circuit unit;

FIG. 6 is a diagram illustrating an evaluation result;

DETAILED DESCRIPTION

Figure 1:
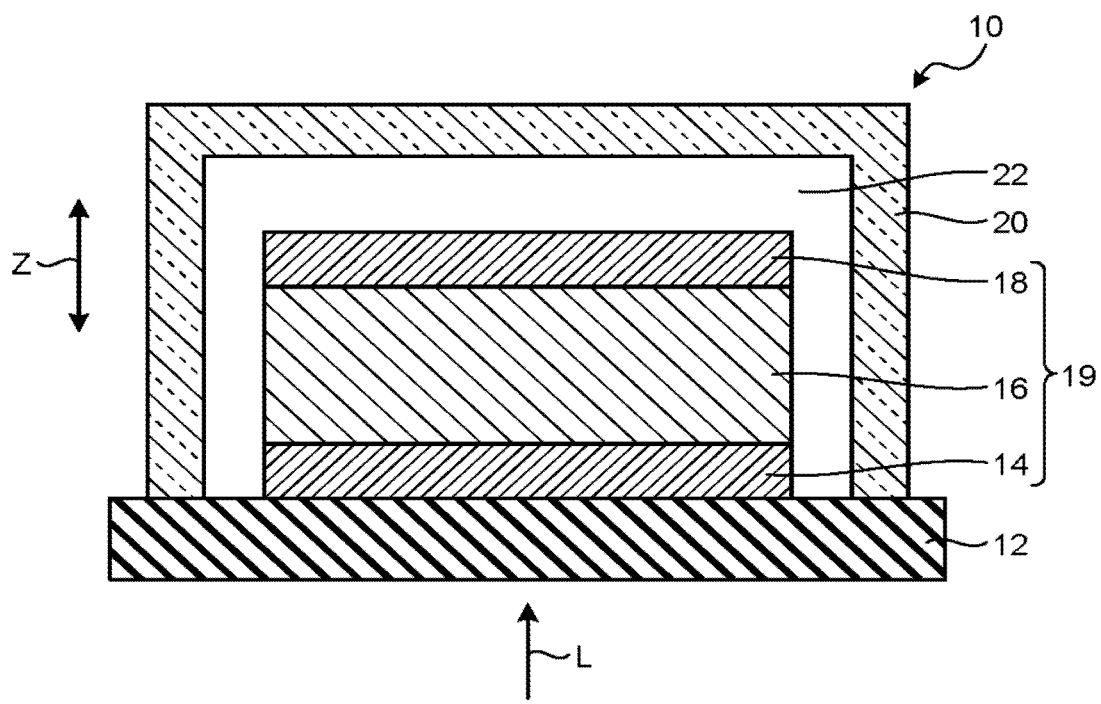
FIG. 1 is a schematic view of a radiation detection element.

According to an embodiment, a producing method of a radiation detection element, includes: forming an organic semiconductor layer by applying an organic semiconductor solution onto a first conductive layer formed on a support substrate; forming a second conductive layer on the organic semiconductor layer; sealing a laminated body of the first conductive layer, the organic semiconductor layer, and the second conductive layer, formed on the support substrate, with a sealing member; and applying heat to the laminated body sealed with the sealing member. In at least one of forming of the organic layer and forming of the second conductive layer, a forming environment of the organic semiconductor layer and the second conductive layer are adjusted such that a solvent content of the organic semiconductor layer is in a predetermined range.

Hereinafter, this embodiment will be described in detail, with reference to the attached drawings. Furthermore, the same reference numerals will be applied to the same constituents, and the repeated description may be omitted.

First Embodiment

FIG. 1 is a schematic view illustrating an example of a radiation detection element 10 of this embodiment.

The radiation detection element 10 is an element detecting a radiation L. The radiation detection element 10 includes a support substrate 12, a first conductive layer 14, an organic semiconductor layer 16, a second conductive layer 18, and a sealing member 20.

Specifically, in the radiation detection element 10, a laminated body 19 in which the first conductive layer 14, the organic semiconductor layer 16, and the second conductive layer 18 are laminated on the support substrate 12, in this order, is sealed with the sealing member 20.

In this embodiment, the radiation L is incident on the organic semiconductor layer 16 through the support substrate 12 and the first conductive layer 14, as an example. Furthermore, the radiation L may be incident on the organic semiconductor layer 16 from the second conductive layer 18 side.

The support substrate 12 is a member supporting the laminated body 19. The support substrate 12, for example, is configured of an inorganic material or an organic material.

The inorganic material configuring the support substrate 12, for example, includes at least one selected from the group consisting of quartz, glass, sapphire, and titania.

The organic material configuring the support substrate 12, for example, includes at least one selected from the group consisting of polyethylene terephthalate, polyethylene naphthalate, polyether sulfone, polyimide, nylon, polystyrene, polyvinyl alcohol, vinyl chloride, polyethylene, polyvinylidene chloride, aramid, polyphenylene sulfide, polyurethane, polycarbonate, and an epoxy resin.

The shape of the support substrate 12 is not limited. For example, the support substrate 12 is in the shape of a plate, a film, or a sheet.

The thickness of the support substrate 12 is not limited. The thickness of the support substrate 12, for example, is greater than or equal to 5 µm and less than or equal to 20 mm.

Furthermore, a thickness direction in this embodiment, is coincident with a lamination direction (a direction of an arrow Z) of the support substrate 12, the first conductive layer 14, the organic semiconductor layer 16, and the second conductive layer 18 in the radiation detection element 10. For this reason, the thickness of the support substrate 12 is the length of the support substrate 12, in the lamination direction (the direction of the arrow Z).

The first conductive layer 14 has conductivity. One of the first conductive layer 14 and the second conductive layer 18 described below, has a function of collecting holes generated in the organic semiconductor layer 16. In addition, the other one of the first conductive layer 14 and the second conductive layer 18, has a function of collecting electrons generated in the organic semiconductor layer 16.

The first conductive layer 14 is configured of a material having conductivity. The first conductive layer 14, for example, contains a metal, a metal oxide, an alloy, or a conductive polymer.

The metal contained in the first conductive layer 14, for example, includes at least one selected from the group consisting of lithium, sodium, potassium, calcium, magnesium, barium, strontium, zirconium, titanium, molybdenum, tungsten, manganese, cobalt, nickel, indium, aluminum, tin, gold, platinum, silver, and copper.

The metal oxide contained in the first conductive layer 14, for example, includes at least one selected from the group consisting of indium oxide, zinc oxide, tin oxide, indium tin oxide (ITO), tin oxide containing fluorine (FTO), an indium-zinc oxide (IZO), and an indium-gallium-zinc oxide (IGZO). In addition, the metal oxide contained in the first conductive layer 14, may be an oxide of the metals described above.

The alloy contained in the first conductive layer 14, for example, is an alloy containing the metals described above.

The conductive polymer contained in the first conductive layer 14, for example, is an organic conductive polymer. The organic conductive polymer, for example, includes at least one selected from the group consisting of polyaniline, a polyaniline derivative, polythiophene, and a polythiophene derivative.

Furthermore, the first conductive layer 14 may be configured of a plurality of conductive films having work functions different from each other. In this case, the number of conductive films configuring the first conductive layer 14, may be 1, or may be greater than or equal to 2.

The thickness of the first conductive layer 14 is not limited. The thickness of the first conductive layer 14, for example, is preferably greater than or equal to 5 nm and less than or equal to 1 μm, and is more preferably greater than or equal to 15 nm and less than or equal to 300 nm. The thickness of the first conductive layer 14 is set to be in the range described above, and thus, it is possible to suppress sheet resistance of the first conductive layer 14. In addition, the thickness of the first conductive layer 14 is set to be in the range described above, and thus, it is possible to suppress a decrease in the transmittance of the radiation L. In addition, the thickness of the first conductive layer 14 is set to be in the range described above, and thus, it is possible to form the first conductive layer 14 as a layer having flexibility, and to suppress the occurrence of a crack due to a stress.

The organic semiconductor layer 16 converts the radiation L incident on the radiation detection element 10, into a charge. That is, the organic semiconductor layer 16 has a function as a photoelectric conversion layer. The type of radiation L that is converted into the charge by the organic semiconductor layer 16, is not limited. For example, the radiation L is at least one type of a β ray, a heavy particle ray, an α ray, a neutron ray, and a γ ray.

The organic semiconductor layer 16 is arranged between the first conductive layer 14 and the second conductive layer 18.

A configuration material of the organic semiconductor layer 16 may be a material capable of converting the radiation L into the charge, but is not limited. In this embodiment, the organic semiconductor layer 16 contains a first compound and a second compound.

The first compound is a first conductivity type compound. The first conductivity type compound indicates a semiconductor using holes as a carrier that carries charges. That is, the first compound is a p type semiconductor (an electron donor).

It is preferable that the first compound contained in the organic semiconductor layer 16 contains at least one of polythiophene and a polythiophene derivative, from the viewpoint of realizing a high photoelectric conversion efficiency.

The polythiophene and the polythiophene derivative are a conductive polymer having a π-conjugated structure, and have a thiophene skeleton. For this reason, the polythiophene and the polythiophene derivative have excellent stereoregularity. The polythiophene and the polythiophene derivative have comparatively high solubility with respect to a solvent.

The polythiophene, for example, includes at least one selected from the group consisting of polyaryl thiophene, polyalkyl isothionaphthene, and polyethylene dioxythiophene.

The polyaryl thiophene, for example, includes at least one of polyalkyl thiophene such as poly(3-methyl thiophene), poly(3-butyl thiophene), poly(3-hexyl thiophene), poly(3-octyl thiophene), poly(3-decyl thiophene), and poly(3-dodecyl thiophene), poly(3-phenyl thiophene), and poly(3-(p-alkyl phenyl thiophene)).

The polyalkyl isothionaphthene, for example, includes at least one selected from the group consisting of poly(3-butyl isothionaphthene), poly(3-hexyl isothionaphthene), poly(3-octyl isothionaphthene), and poly(3-decyl isothionaphthene).

The polythiophene derivative, for example, includes at least one selected from the group consisting of carbazole, benzothiadiazole, and a copolymer of thiophene. The copolymer of the thiophene, for example, includes poly[N-9"-hepta-decanyl-2,7-carbazole-alt-5,5-(4',7'-di-2-thienyl-2',1', 3'-benzothiadiazole)] (PCDTBT).

That is, it is preferable that the first compound includes at least one selected from the group consisting of poly(3-methyl thiophene), poly(3-butyl thiophene), poly(3-hexyl thiophene), poly(3-octyl thiophene), poly(3-decyl thiophene), poly(3-dodecyl thiophene), poly(3-phenyl thiophene), poly(3-(p-alkyl phenyl thiophene)), poly(3-butyl isothionaphthene), poly(3-hexyl isothionaphthene), poly(3-octyl isothionaphthene), poly(3-decyl isothionaphthene), and polyethylene dioxythiophene. Among them, it is particularly preferable that the first compound includes at least the poly(3-hexyl thiophene).

The second compound is a second conductivity type compound. The second conductivity type compound is a semiconductor using electrons as a carrier that carries charges. That is, the second compound is an n type semiconductor (electron acceptor).

It is preferable that the second compound contained in the organic semiconductor layer 16 includes at least one of fullerene and a fullerene derivative, for reasons of accepting properties of electrons from an electron-electron-donating compound, or retaining properties of the accepted electrons.

The fullerene and the fullerene derivative are an organic n type compound (an n type organic semiconductor), and are an electron-accepting compound. In other words, the fullerene and the fullerene derivative is a compound accepting the electrons from the electron-donating compound, at the time of absorbing the radiation L. In this embodiment, the fullerene and the fullerene derivative contained in the organic semiconductor layer 16 accept electrons from the first compound contained in the organic semiconductor layer 16, at the time of absorbing the radiation L.

The fullerene is low-order fullerene having carbon atoms of greater than or equal to 20 and less than or equal to 59, or high-order fullerene having carbon atoms of greater than or equal to 60. Furthermore, a carbon nanotube is not included in the fullerene.

It is preferable that the fullerene is the high-order fullerene. The high-order fullerene, for example, is fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene, and the like. Furthermore, the number subscribed to C, indicates the number of carbon atoms.

Furthermore, the fullerene $C_{60}$, the fullerene $C_{70}$, the fullerene $C_{76}$, the fullerene $C_{78}$, the fullerene $C_{84}$, and the like are preferable as the fullerene contained in the organic semiconductor layer 16, for reasons of the purity of a material.

The fullerene derivative indicates a compound in which a functional group is added to such fullerenes.

It is preferable that the functional group added to the fullerenes in the fullerene derivative, includes a functional group having high affinity with respect to a solvent, from the viewpoint of realizing solubility with respect to a solvent.

It is preferable that the fullerene derivative has at least any one selected from the group consisting of a hydrogen atom, a hydroxyl group, a halogen atom, an alkyl group, an alkenyl group, a cyano group, an aromatic hydrocarbon group, and an aromatic heterocyclic group, as the functional group.

The halogen atom, for example, includes at least one selected from the group consisting of a fluorine atom and a chlorine atom. The alkyl group, for example, includes at least one selected from the group consisting of a methyl group and an ethyl group. The alkenyl group, for example, includes a vinyl group. The alkoxy group, for example, includes at least one selected from the group consisting of a methoxy group and an ethoxy group. The aromatic hydrocarbon group, for example, includes at least one selected from the group consisting of a phenyl group and a naphthyl group. The aromatic heterocyclic group, for example, includes at least one selected from the group consisting of a thienyl group and a pyridyl group.

Furthermore, the fullerene derivative may have a ring formed by bonding a plurality of functional groups to each other.

In addition, the fullerene derivative may include a fullerene-bonded polymer. In addition, the fullerene derivative may include hydrogenated fullerene. The hydrogenated fullerene, for example, includes $C_{60}H_{36}$ and $C_{70}H_{36}$. In addition, the fullerene derivative may include a fullerene metal complex.

In addition, the fullerene derivative may include fullerene oxide. The fullerene oxide is formed by oxidizing at least a part of the carbon atoms of the fullerene. The fullerene oxide is formed by oxidizing $C_{60}$ or $C_{70}$.

In addition, the fullerene derivative may include at least one selected from the group consisting of [6,6]-phenyl-$C_{61}$-butyric acid methyl ester (60PCBM), [6,6]-phenyl-$C_{71}$-butyric acid methyl ester (70PCBM), an indene-$C_{60}$-bis-adduct (60ICBA), a dihydronaphthyl-$C_{60}$-bis-adduct (60NCBA), and a dihydronaphthyl-$C_{70}$-bis-adduct (70NCBA). The 60PCBM is unmodified fullerene. In the 60PCBM, the mobility of a photocarrier is high.

That is, it is preferable that the second compound includes at least one selected from the group consisting of $C_{60}H_{36}$, $C_{70}H_{36}$, [6,6]-phenyl-$C_{61}$-butyric acid methyl ester, [6,6]-phenyl-$C_{71}$-butyric acid methyl ester, an indene-$C_{60}$-bis-adduct, a dihydronaphthyl-$C_{60}$-bis-adduct, and a dihydronaphthyl-$C_{70}$-bis-adduct. In addition, it is preferable that the first compound includes poly(3-hexyl thiophene). In addition, it is preferable that the second compound includes [6,6]-phenyl-$C_{71}$-butyric acid methyl ester. Among them, it is particularly preferable that the second compound includes at least the [6,6]-phenyl-$C_{71}$-butyric acid methyl ester.

The thickness of the organic semiconductor layer 16 is not limited. The thickness of the organic semiconductor layer 16 is preferably greater than or equal to 1 µm, is more preferably greater than or equal to 1 µm and less than or equal to 2000 µm, and is particularly preferably greater than or equal to 10 µm and less than or equal to 1000 µm.

In a case where the thickness of the organic semiconductor layer 16 is set to be in the range described above, a high capture efficiency of the radiation L (for example, an α ray and a β ray) is obtained, and the radiation L incident on the organic semiconductor layer 16 is effectively converted into the charge. In addition, in a case where the thickness of the organic semiconductor layer 16 is set to be in the range described above, in particular, the β ray can be converted into the charge with a higher sensitivity.

In addition, in a case where the thickness of the organic semiconductor layer 16 is less than or equal to 2000 µm, the height of the sensitivity with respect to a γ ray is suppressed, and thus, the β ray can be selectively converted into the charge.

Furthermore, the thickness of the organic semiconductor layer 16 may be suitably adjusted according to the configuration material of the organic semiconductor layer 16.

For example, there is a case where the organic semiconductor layer 16 is configured of at least one of 60PCBM and P3HT, from the viewpoint of being applied to a solar battery. In this case, it is preferable that the thickness of the organic semiconductor layer 16 is less than or equal to 500 nm.

In a case where the thickness of the organic semiconductor layer 16 is less than or equal to 500 nm, the organic semiconductor layer 16 is capable of absorbing light in all wavelength ranges included in solar light. On the other hand, in a case where the thickness of the organic semiconductor layer 16 is greater than 500 nm, there is a case where a charge transportation distance increases, a loss due to deactivation increases, and a photoelectric conversion efficiency decreases. In addition, in a case where the thickness of the organic semiconductor layer 16 is greater than 500 nm, there is a case where internal resistance of the organic semiconductor layer 16 increases, and the photoelectric conversion efficiency of the organic semiconductor layer 16 decreases.

Here, the transmittivity of the radiation L is higher than the transmittivity of the solar light. For this reason, in a case where the organic semiconductor layer 16 converts the radiation L into the charge, the thickness of the organic semiconductor layer 16 is greater than or equal to 1 µm, and thus, it is possible to directly convert the radiation L into the charge with a high efficiency, and to realize high sensitivity.

In this embodiment, the solvent content of the organic semiconductor layer 16 of the radiation detection element 10, is in a range of greater than 0.005 weight % and less than 11 weight %. In addition, it is preferable that the solvent content of the organic semiconductor layer 16 is in a range of greater than or equal to 0.01 weight % and less than or equal to 2.5 weight %.

The solvent content of the organic semiconductor layer 16, is the content of the solvent contained in the organic semiconductor layer 16 of the radiation detection element 10 after being produced (after being completed) as the radiation detection element 10.

The solvent content of the organic semiconductor layer 16 is adjusted in a producing step of the radiation detection element 10 described below (the details will be described below).

Next, the second conductive layer 18 will be described.

The second conductive layer 18 has conductivity. The second conductive layer 18 is configured of a material having conductivity. The second conductive layer 18, for example, contains a metal, a metal oxide, an alloy, or an inorganic salt.

The metal contained in the second conductive layer 18, for example, is at least one selected from the group consisting of platinum, gold, silver, copper, iron, tin, zinc, aluminum, indium, chromium, lithium, sodium, potassium, cesium, calcium, and magnesium.

The alloy contained in the second conductive layer 18 is an alloy containing the metals described above.

The inorganic salt contained in the second conductive layer 18, for example, is lithium fluoride or cesium fluoride.

The metal oxide contained in the second conductive layer 18, for example, is at least one selected from the group consisting of indium oxide, zinc oxide, tin oxide, indium tin oxide (ITO), tin oxide containing fluorine (FTO), an indium-zinc oxide (IZO), an indium-gallium-zinc oxide (IGZO), nickel oxide, aluminum oxide, lithium oxide, and cesium oxide.

Furthermore, as with the first conductive layer 14, the second conductive layer 18 may be configured of a plurality of conductive films having work functions different from each other. In this case, the number of conductive films configuring the second conductive layer 18, may be 1, or may be greater than or equal to 2.

The thickness of the second conductive layer 18 is not limited. The thickness of the second conductive layer 18, for example, is preferably greater than or equal to 1 nm and less than or equal to 1 μm, is more preferably greater than or equal to 1 nm and less than or equal to 500 nm, and is particularly preferably greater than or equal to 10 nm and less than or equal to 300 nm.

In a case where the thickness of the second conductive layer 18 is in the range described above, it is possible to suppress sheet resistance of the second conductive layer 18. Furthermore, the sheet resistance of the second conductive layer 18, for example, is preferably less than or equal to 500Ω/square, and is more preferably less than or equal to 200Ω/square. In addition, in a case where the thickness of the second conductive layer 18 is in the range described above, it is possible to suppress property degradation of the organic semiconductor layer 16 by applying heat to the organic semiconductor layer 16 at the time of forming the second conductive layer 18 described below.

Next, the sealing member 20 will be described.

The sealing member 20 is a member for sealing the laminated body 19 of the first conductive layer 14, the organic semiconductor layer 16, and the second conductive layer 18, formed on the support substrate 12.

That is, the laminated body 19 (the first conductive layer 14, the organic semiconductor layer 16, and the second conductive layer 18) is sealed with the support substrate 12 and the sealing member 20. Specifically, an outer edge of the sealing member 20 and an outer edge of the support substrate 12 are physically connected to each other, and thus, the laminated body 19 (the first conductive layer 14, the organic semiconductor layer 16, and the second conductive layer 18) is in a state of being arranged in a space 22 surrounded by the support substrate 12 and the sealing member 20. For this reason, the first conductive layer 14, the organic semiconductor layer 16, and the second conductive layer 18 are in a state of being airtightly sealed with the support substrate 12 and the sealing member 20. The laminated body 19 is sealed with the sealing member 20, and thus, it is possible to realize stable properties or high reliability of the radiation detection element 10.

A configuration material of the sealing member 20 may be a material capable of sealing the laminated body 19, but is not limited. For example, glass and a polymer film may be used in the sealing member 20.

Next, the function of the radiation detection element 10 will be described.

It is assumed that the radiation L is incident on the radiation detection element 10. For example, the radiation L is incident on the organic semiconductor layer 16 through the support substrate 12 and the first conductive layer 14. The radiation L is incident on the organic semiconductor layer 16, and thus, excitons are generated in the organic semiconductor layer 16, and movable charges (electrons and holes) are generated.

Here, the organic semiconductor layer 16 of the radiation detection element 10 contains the first compound and the second compound, as described above. For this reason, the organic semiconductor layer 16 has a bulk heterojunction structure of the first compound that is the p type semiconductor and the second compound that is the n type semiconductor. In the bulk heterojunction structure, it is possible to expand a phase interface between the p type semiconductor and the n type semiconductor. The bulk heterojunction type organic semiconductor layer 16 has a microphase-separated structure of the p type semiconductor and the n type semiconductor. In the organic semiconductor layer 16, the phase of the p type semiconductor and the phase of the n type semiconductor are separated from each other. For this reason, the organic semiconductor layer 16 includes a pn-junction.

For this reason, in a case where the radiation L is incident on the organic semiconductor layer 16, a positive charge (the hole) and a negative charge (the electron) are separated from each other on a phase interface of the pn-junction in the organic semiconductor layer 16. Such charges are transported to the second conductive layer 18 or the first conductive layer 14.

Then, a bias voltage (or an electric field) is applied between the first conductive layer 14 and the second conductive layer 18, and thus, the charges generated in the organic semiconductor layer 16, are taken out as an output signal. The output signal is a signal according to the intensity of the incident radiation L. The output signal (that is, the amount of charge) is detected, and thus, the radiation detection element 10 is capable of detecting the radiation L.

Next, a producing method of the radiation detection element 10 will be described.

Figure 2:
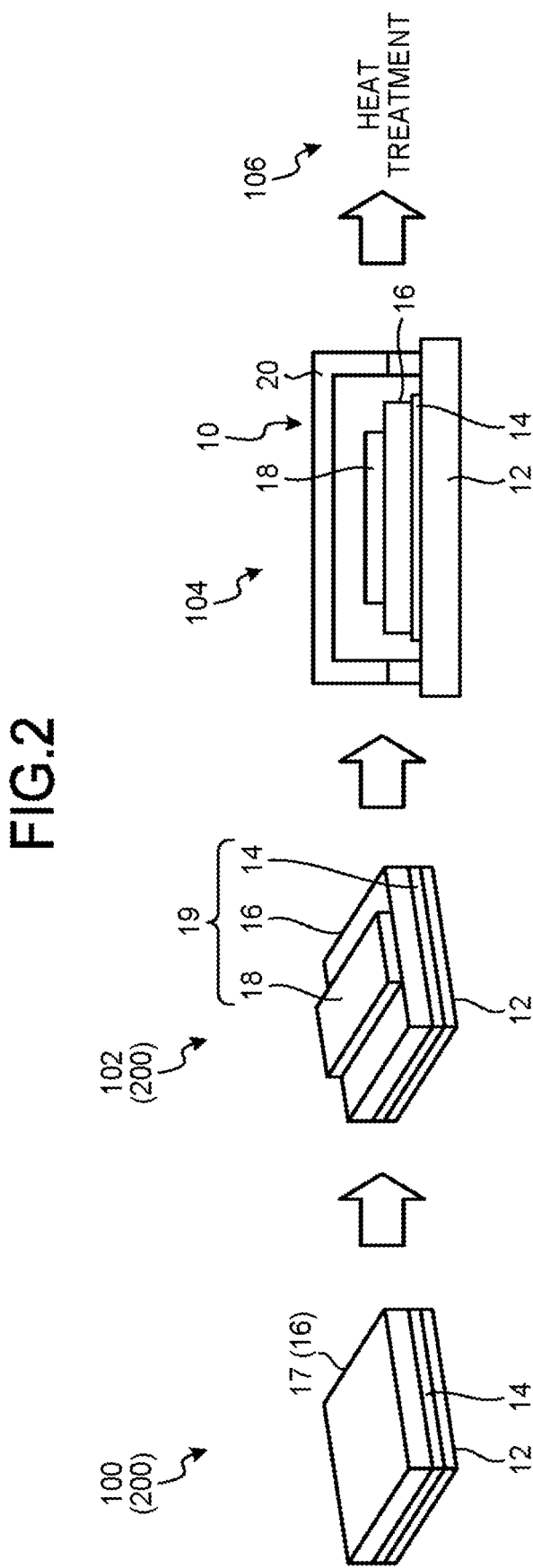
FIG. 2 is an explanatory diagram of a producing method of a radiation detection element.

FIG. 2 is an explanatory diagram of the producing method of the radiation detection element 10.

In the producing method of the radiation detection element 10 of this embodiment, an organic layer forming step 100, a second conductive layer forming step 102, a sealing step 104, and a heating step 106 are executed in this order. In addition, at least one of the organic layer forming step 100 and the second conductive layer forming step 102 includes an adjusting step 200. Hereinafter, each step will be described in detail.

The organic layer forming step 100 is a step of forming the organic semiconductor layer 16 by applying an organic semiconductor solution 17 onto the first conductive layer 14 formed on the support substrate 12.

First, the support substrate 12 on which the first conductive layer 14 is formed, is prepared. The first conductive layer 14 may be formed on the support substrate 12, according to a known method such as deposition. For example, the first conductive layer 14 may be formed on the support substrate 12, according to a vacuum deposition method, a sputtering method, an ion plating method, a plating method, a coating method, and the like.

Then, in the organic layer forming step 100, the organic semiconductor solution 17 is applied onto the first conductive layer 14 formed on the support substrate 12. Specifically, the configuration material of the organic semiconductor layer 16, described above, is dissolved in a solvent, and thus, the organic semiconductor solution 17 is produced, and is applied onto the first conductive layer 14.

For example, at least one selected from the group consisting of an unsaturated hydrocarbon-based solvent, a halogenated aromatic hydrocarbon-based solvent, a halogenated saturated hydrocarbon-based solvent, and ethers, may be used as the solvent used in the organic semiconductor solution 17.

The unsaturated hydrocarbon-based solvent, for example, includes at least one selected from the group consisting of toluene, xylene, tetralin, decalin, mesitylene, n-butyl benzene, sec-butyl benzene, and tert-butyl benzene. The halogenated aromatic hydrocarbon-based solvent, for example, includes at least one selected from the group consisting of chlorobenzene, dichlorobenzene, and trichlorobenzene.

The halogenated saturated hydrocarbon-based solvent, includes at least one selected from the group consisting of carbon tetrachloride, chloroform, dichloromethane, dichloroethane, chlorobutane, bromobutane, chloropentane, chlorohexane, bromohexane, and chlorocyclohexane. The ethers, for example, include at least one selected from the group consisting of tetrahydrofuran and tetrahydropyran. The halogenated aromatic hydrocarbon-based solvent may be independently used, or may be used by being mixed.

Furthermore, in a case where a ratio (Cp/Cn) of a concentration (Cp) of the first compound to a concentration (Cn) of the second compound, contained in the organic semiconductor solution 17, is represented by a ratio of weight %, the ratio (Cp/Cn) is preferably greater than or equal to 0.05 and less than or equal to 20, and is particularly preferably greater than or equal to 0.2 and less than or equal to 5.

A coating method of the organic semiconductor solution 17 may be a wet process, but is not limited. The coating method of the organic semiconductor solution 17, used in the organic layer forming step 100, for example, is at least one selected from the group consisting of a drop casting method, a spin coating method, a dip coating method, a casting method, a bar coating method, a roll coating method, a wire bar coating method, a spraying method, a screen printing method, a gravure printing method, a flexo printing method, a set printing method, a gravure and offset printing method, a dispenser coating method, a nozzle coating method, a capillary coating method, and an ink jet method. Furthermore, in the coating method of the organic semiconductor solution 17, two or more of the coating methods described above may be used by being combined. In a case of using the printing method, it is possible to produce a large-area radiation detection element 10 at a low cost by using an inexpensive device.

The thickness of the organic semiconductor layer 16 immediately after being formed according to the coating of the organic semiconductor solution 17 (before being heated), for example, is greater than or equal to 25 μm and less than or equal to 50 μm, but is not limited thereto.

The second conductive layer forming step 102 is a step of forming the second conductive layer 18 on the organic semiconductor layer 16 formed according to the coating of the organic semiconductor solution 17.

The second conductive layer 18, for example, may be formed by using a method including at least one selected from the group consisting of a vacuum deposition method, a sputtering method, an ion plating method, a plating method, and a coating method.

The sealing step 104 is a step of sealing the laminated body 19 (the support substrate 12, the first conductive layer 14, and the organic semiconductor layer 16), formed on according to the organic layer forming step 100 and the second conductive layer forming step 102, with the sealing member 20.

The heating step 106 is a step of applying heat to the laminated body 19 sealed with the sealing member 20.

Here, as described above, in the producing method of the radiation detection element 10 of this embodiment, at least one of the organic layer forming step 100 and the second conductive layer forming step 102 includes the adjusting step 200.

The adjusting step 200 is a step of adjusting a forming environment of the organic semiconductor layer 16 and the second conductive layer 18 such that the solvent content of the organic semiconductor layer 16 is maintained in a predetermined range.

Specifically, the adjusting step 200 is a step of adjusting the forming environment of the organic semiconductor layer 16 in the organic layer forming step 100 and the forming environment of the second conductive layer 18 in the second conductive layer forming step 102, such that the content of the solvent contained in the organic semiconductor layer 16 of the radiation detection element 10 is in the predetermined range described above in a state after being produced (after being completed) as the radiation detection element 10.

Here, as described above, the solvent content of the organic semiconductor layer 16 in the completed radiation detection element 10, is in the range of greater than 0.005 weight % and less than 11 weight %, and is preferably in the range of greater than or equal to 0.01 weight % and less than or equal to 2.5 weight %. For this reason, the predetermined range described above is in such a range, that is, the range of greater than 0.005 weight % and less than 11 weight %, and is preferably in the range of greater than or equal to 0.01 weight % and less than or equal to 2.5 weight %.

Furthermore, the adjusting step 200 may be a step of adjusting the forming environment such that the content of the solvent contained in the organic semiconductor layer 16 of the radiation detection element 10 in a state after being produced as the radiation detection element 10 (after being completed), is in the predetermined range described above, but the specific means is not limited.

For example, in the adjusting step 200, at least one of an air flow with respect to the organic semiconductor layer 16, a temperature, an atmospheric pressure, and a solvent concentration of the organic semiconductor solution 17, is adjusted as the forming environment.

For example, in the adjusting step 200, normal temperature gas is sprayed from a nozzle towards the organic semiconductor layer 16, at least one of at the time of forming the organic semiconductor layer 16 according to the coating of the organic semiconductor solution 17 and at the time of forming the second conductive layer 18, and thus, the air of the normal temperature gas is sent to the organic semiconductor layer 16. The air flow of the air is adjusted while the air is continuously sent to the organic semiconductor layer 16, and thus, the solvent concentration of the organic semiconductor solution 17 is adjusted.

Furthermore, the type of normal temperature gas is not limited. The type of normal temperature gas, for example, is nitrogen, argon, air, helium, and the like.

In addition, a case where the organic layer forming step 100 includes the adjusting step 200, is assumed. In this case, in the adjusting step 200, a temperature around the organic semiconductor layer 16 formed of the organic semiconductor solution 17 applied onto the first conductive layer 14, and a time when the temperature is maintained, are adjusted, and thus, the amount of solvent in the organic semiconductor layer 16 is adjusted. The temperature and the time when the temperature is maintained, may be suitably adjusted according to the type of solvent contained in the organic semiconductor solution 17, a coated amount of the organic semiconductor solution 17, or the like.

That is, in the organic layer forming step 100, the temperature around the organic semiconductor layer 16 formed of the organic semiconductor solution 17 applied onto the first conductive layer 14, is a temperature lower than a boiling point of the solvent contained in the organic semiconductor layer 16. In addition, the time when the temperature is maintained, may be adjusted according to at least one of the type of solvent, and the temperature to be maintained, the coated amount of the organic semiconductor solution 17, a desired solvent content, and the like.

For example, in a case where the solvent contained in the organic semiconductor layer 16, is chlorobenzene, in the adjusting step 200, the temperature around the organic semiconductor layer 16 formed in the organic layer forming step 100, may be adjusted to a temperature range of higher than or equal to 40° C. and lower than or equal to 70° C.

In addition, in the adjusting step 200, the solvent content of the organic semiconductor layer 16 may be adjusted according to solvent annealing in which the organic semiconductor layer 16 is exposed to the vapor of the solvent contained in the organic semiconductor layer 16.

As described above, in the producing method of the radiation detection element 10 of this embodiment, at least one of the organic layer forming step 100 and the second conductive layer forming step 102 includes the adjusting step 200. For this reason, the solvent content of the organic semiconductor layer 16 included in the radiation detection element 10 produced according to the steps described above, can be adjusted to a predetermined range (greater than 0.005 weight % and less than 11 weight %). For this reason, in the producing method of the radiation detection element 10 of this embodiment, it is possible to produce the radiation detection element 10 including the organic semiconductor layer 16 in which the amount of contained solvent is in the predetermined range described above.

In a case where the solvent content of the organic semiconductor layer 16 is in the predetermined range described above, it is possible to decrease a dark current of the radiation detection element 10.

In this embodiment, in the adjusting step 200, the forming environment of the organic semiconductor layer 16 and the second conductive layer 18 is adjusted such that the solvent content of the organic semiconductor layer 16 is in the predetermined range described above. For this reason, it is considered that the fluidity of at least one of the p type semiconductor (the first compound) and the n type semiconductor (the second compound), contained in the organic semiconductor layer 16, increases, while the organic semiconductor layer 16 is formed according to the coating of the organic semiconductor solution 17, and the laminated body 19 including the organic semiconductor layer 16 and the second conductive layer 18 is sealed with the sealing member 20, and then, is heated.

Then, the organic semiconductor layer 16 in which the amount of contained solvent is adjusted in the adjusting step 200, is sealed with the sealing member 20 in the sealing step 104, and then, is heated in the heating step 106. For this reason, the organic semiconductor layer 16 is heated in the heating step 106, in a state of suppressing a variation in the amount of contained solvent due to the influence of the external environment of the sealing member 20. According to the heating step 106, it is considered that the aggregation and the crystallization of the p type semiconductor (the first compound) and the n type semiconductor (the second compound), are accelerated.

For this reason, it is considered that an interface between the p type semiconductor (the first compound) and the n type semiconductor (the second compound), contained in the organic semiconductor layer 16, decreases, and thus, the dark current of the radiation detection element 10 decreases.

As described above, the solvent content of the organic semiconductor layer 16 of the radiation detection element 10 in this embodiment, is in the range of greater than 0.005 weight % and less than 11 weight %. In addition, it is preferable that the solvent content of the organic semiconductor layer 16 is in the range of greater than or equal to 0.01 weight % and less than or equal to 2.5 weight %.

In a case where the solvent content of the organic semiconductor layer 16 in the radiation detection element 10 is greater than 0.005 weight %, in at least one step of the organic layer forming step 100 and the second conductive layer forming step 102, it is possible to apply sufficient fluidity to the p type semiconductor (the first compound) and the n type semiconductor (the second compound). For this reason, it is considered that the aggregation and the crystallization of the p type semiconductor (the first compound) and the n type semiconductor (the second compound), are accelerated, and the interface between the p type semiconductor (the first compound) and the n type semiconductor (second compound), decreases, and thus, the dark current of the radiation detection element 10 decreases.

In addition, in a case where the solvent content of the organic semiconductor layer 16 in the radiation detection element 10 is less than 11 weight %, it is considered that it is possible to suppress the formation of a conductive bus of free electrons (carriers) according to the solvent contained in the organic semiconductor layer 16, and to suppress an increase in the dark current.

As described above, the producing method of the radiation detection element 10 of this embodiment, includes the organic layer forming step 100, the second conductive layer forming step 102, the sealing step 104, and the heating step 106. In addition, at least one of the organic layer forming step 100 and the second conductive layer forming step 102 includes the adjusting step 200.

The organic layer forming step 100 is a step of forming the organic semiconductor layer 16 by applying the organic semiconductor solution 17 onto the first conductive layer 14 formed on the support substrate 12. The second conductive layer forming step 102 is a step of forming the second conductive layer 18 on the organic semiconductor layer 16. The sealing step 104 is a step of sealing the laminated body 19 of the first conductive layer 14, the organic semiconductor layer 16, and the second conductive layer 18, formed on the support substrate 12, with the sealing member 20. The heating step 106 is a step of applying heat to the laminated body 19 sealed with the sealing member 20. The adjusting step 200 is a step of adjusting the forming environment of the organic semiconductor layer 16 and the second conductive layer 18 such that the solvent content of the organic semiconductor layer 16 is maintained in a predetermined range.

Thus, in the adjusting step 200 of the producing method of the radiation detection element 10 of this embodiment, the forming environment of the organic semiconductor layer 16 and the second conductive layer 18 is adjusted such that the solvent content of the organic semiconductor layer 16 is maintained in a predetermined range such as the range of greater than 0.005 weight % and less than 11 weight %.

For this reason, in the producing method of the radiation detection element 10 of this embodiment, it is possible to apply sufficient fluidity to the compound contained in the organic semiconductor layer 16 at the time of being produced, and to decrease a plurality of interfaces. For this reason, it is possible to produce the radiation detection element 10 in which the dark current is reduced.

Accordingly, in the producing method of the radiation detection element 10 of this embodiment, it is possible to improve a detection sensitivity of the radiation L.

On the other hand, in the related art, in a producing step of a radiation detection element, a heating treatment is performed in order to remove a solvent contained in a comparative organic semiconductor layer of the radiation detection element after being produced. Specifically, in the related art, the organic semiconductor solution 17 is applied onto the first conductive layer 14 formed on the support substrate 12, and then, is sufficiently heated, and thus, the comparative organic semiconductor layer is formed, and the second conductive layer 18 is formed on the comparative organic semiconductor layer, and then, is further heated, and the first conductive layer 14, the comparative organic semiconductor layer, and the second conductive layer 18 are sealed with the sealing member 20, and then, are further heated.

That is, in the related art, the production of the radiation detection element, in which the amount of contained solvent of the comparative organic semiconductor layer of the radiation detection element after being produced is in the predetermined range described above, is not performed. That is, in the related art, the production of the radiation detection element, in which the amount of contained solvent of the comparative organic semiconductor layer is in the predetermined range described above, is not performed.

On the other hand, the producing method of the radiation detection element 10 of this embodiment includes the adjusting step 200. For this reason, in the producing method of the radiation detection element 10 of this embodiment, it is possible to improve the detection sensitivity of the radiation L.

In addition, the radiation detection element 10 of this embodiment, produced by the producing method described above, includes the support substrate 12, the first conductive layer 14, the organic semiconductor layer 16, the second conductive layer 18, and the sealing member 20 of the laminated body 19. Then, the solvent content of the organic semiconductor layer 16 is in the range of greater than 0.005 weight % and less than 11 weight %.

Accordingly, the radiation detection element 10 of this embodiment is capable of improving the detection sensitivity of the radiation L.

Furthermore, as described above, it is preferable that the thickness of the organic semiconductor layer 16 of the radiation detection element 10, is greater than or equal to 1 µm.

In a case where the thickness of the organic semiconductor layer 16 is greater than or equal to 1 µm, it is possible to easily adjust the solvent content in the adjusting step 200 at the time of producing the radiation detection element 10, and to realize the radiation detection element 10 in which the dark current is further suppressed.

Second Embodiment

Furthermore, the radiation detection element 10 described in this embodiment described above, may further include an interlayer.

Figure 3:
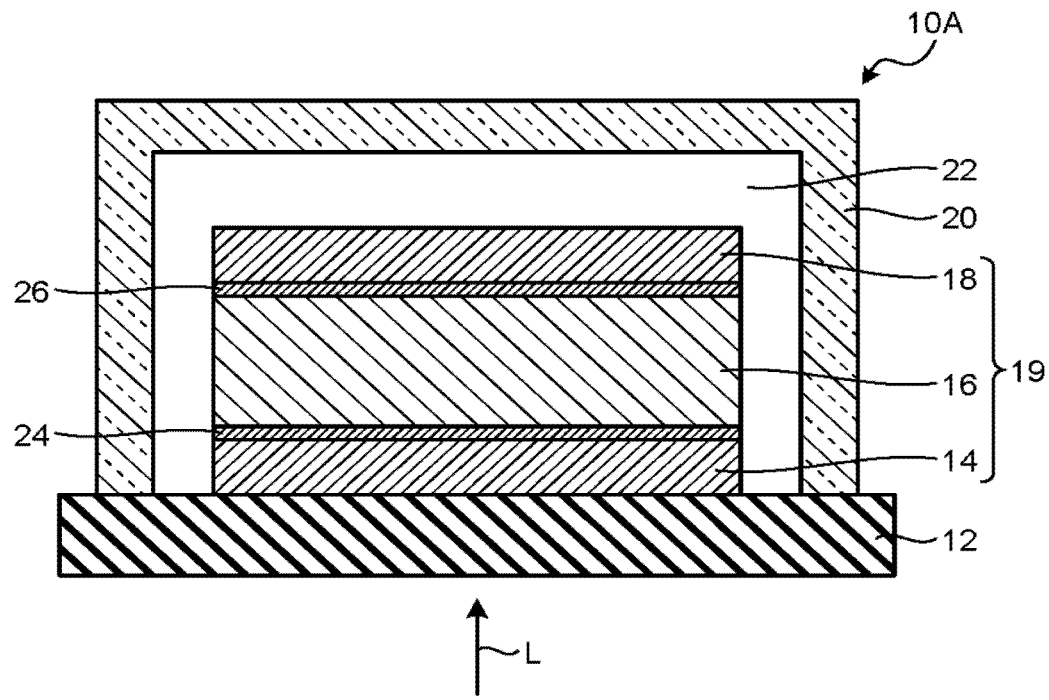
FIG. 3 is a schematic view of the radiation detection element.

FIG. 3 is a schematic view illustrating an example of a radiation detection element 10A of this embodiment.

The radiation detection element 10A includes the support substrate 12, the first conductive layer 14, a first interlayer 24, the organic semiconductor layer 16, a second interlayer 26, the second conductive layer 18, and the sealing member 20.

The radiation detection element 10A is identical to the radiation detection element 10 of the first embodiment, except that the first interlayer 24 is provided between the first conductive layer 14 and the organic semiconductor layer 16, and the second interlayer 26 is provided between the organic semiconductor layer 16 and the second conductive layer 18.

The first interlayer 24 functions as at least one of a hole transport layer and an electron block layer. The second interlayer 26 functions as at least one of an electron transport layer and a hole block layer.

Furthermore, the first interlayer 24 may function as at least one of the electron transport layer and the hole block layer, and the second interlayer 26 may function as at least one of the hole transport layer and the electron block layer.

The electron transport layer has a function of efficiently transporting electrons. The electron transport layer, for example, contains at least one selected from the group consisting of a halogen compound, a metal oxide, an inorganic material, and an n type organic semiconductor.

The halogen compound contained in the electron transport layer, for example, includes at least one selected from the group consisting of LiF, LiCl, LiBr, LiI, NaF, NaCl, NaBr, NaI, KF, KCl, KBr, KI, and CsF. The metal oxide contained in the electron transport layer, for example, includes at least one selected from the group consisting of titanium oxide, molybdenum oxide, vanadium oxide, zinc oxide, calcium oxide, cesium oxide, aluminum oxide, and niobium oxide. Furthermore, the electron transport layer may contain a mixture thereof. The inorganic material contained in the electron transport layer, for example, is metal calcium.

The n type organic semiconductor contained in the electron transport layer, for example, includes at least one selected from the group consisting of fullerene and a fullerene derivative. The n type organic semiconductor contained in the electron transport layer, for example, has a skeleton including at least one selected from the group consisting of $C_{60}$, $C_{70}$, $C_{76}$, $C_{78}$, and $C_{84}$.

The fullerene derivative contained in the electron transport layer, for example, is formed by modifying a carbon atom in a fullerene skeleton with an arbitrary functional group. The fullerene derivative may have a ring formed by bonding a plurality of functional groups to each other. The fullerene derivative may include a fullerene-bonded polymer. In addition, the fullerene derivative may have a functional group having high affinity with respect to the solvent.

The functional group of the fullerene derivative contained in the electron transport layer, for example, includes at least one selected from the group consisting of a hydrogen atom, a hydroxyl group, a halogen atom, an alkyl group, an alkenyl group, a cyano group, an alkoxy group, an aromatic hydrocarbon group, and an aromatic heterocyclic group. The halogen atom, for example, includes at least one selected from the group consisting of a fluorine atom and a chlorine atom. The alkyl group, for example, includes at least one selected from the group consisting of a methyl group and an ethyl group. The alkenyl group, for example, includes a vinyl group and the like. The alkoxy group, for example, includes at least one selected from the group consisting of a methoxy group and an ethoxy group. The aromatic hydrocarbon group, for example, includes at least one selected from the group consisting of a phenyl group and a naphthyl group. The aromatic heterocyclic group, for example, includes at least one selected from the group consisting of a thienyl group and a pyridyl group.

The fullerene derivative contained in the electron transport layer, for example, includes at least one selected from the group consisting of hydrogenated fullerene, oxide fullerene, and a fullerene metal complex. The hydrogenated fullerene, for example, includes at least one selected from the group consisting of $C_{60}H_{36}$ and $C_{70}H_{36}$. The fullerene derivative contained in the electron transport layer, for example, may include at least one selected from the group consisting of [6,6]-phenyl-$C_{61}$-butyric acid methyl ester (60PCBM) and [6,6]-phenyl-$C_{71}$-butyric acid methyl ester (70PCBM).

The n type organic semiconductor contained in the electron transport layer, for example, may be a low-molecular compound. The low-molecular compound can be formed into a film according to deposition. A number average molecular weight Mn of the low-molecular compound, is substantially coincident with a weight average molecular weight Mw. At least one of the number average molecular weight Mn and the weight average molecular weight Mw of the low-molecular compound, is less than or equal to 10000.

The n type organic semiconductor contained in the electron transport layer, for example, may include at least one selected from the group consisting of bathocuproine (BCP), 4,7-diphenyl-1,10-phenanthroline (Bphen), 1,3,5-tri(p-pyrid-3-yl-phenyl)benzene (TpPyPB), and diphenyl bis(4-pyridin-3-yl)phenyl)silane (DPPS).

The thickness of the electron transport layer, for example, is greater than or equal to 5 nm and less than or equal to 100 nm. In a case where the thickness of the electron transport layer is less than or equal to 100 nm, it is possible to decrease the resistance of the electron transport layer, and to realize a high charge conversion efficiency of the organic semiconductor layer 16. In addition, in a case where thickness of the electron transport layer is greater than or equal to 5 nm, it is possible to suppress the deactivation of the excitons generated in the organic semiconductor layer 16 before releasing electrons and holes.

The hole transport layer, for example, has a function of efficiently transporting holes. The hole transport layer, for example, includes at least one selected from the group consisting of a p type organic semiconductor material and a metal oxide.

The p type organic semiconductor contained in the hole transport layer, for example, includes a copolymer having a donor unit and an acceptor unit. The donor unit, for example, includes at least one selected from the group consisting of fluorene and thiophene. The acceptor unit, for example, includes benzothiadiazole and the like.

The p type organic semiconductor contained in the hole transport layer, for example, includes at least one selected from the group consisting of polythiophene, a polythiophene derivative, polypyrrole, a polypyrrole derivative, a pyrazoline derivative, an aryl amine derivative, a stilbene derivative, a triphenyl diamine derivative, oligothiophene, an oligothiophene derivative, polyvinyl carbazole, a polyvinyl carbazole derivative, polysilane, a polysilane derivative, a polysiloxane derivative, polyaniline, a polyaniline derivative, a phthalocyanine derivative, porphyrin, a porphyrin derivative, polyphenylene vinylene, a polyphenylene vinylene derivative, polythienylene vinylene, a polythienylene vinylene derivative, a benzodithiophene derivative, and a thieno[3,2-b]thiophene derivative.

A side chain of the polysiloxane derivative, for example, includes aromatic amine. A main chain of the polysiloxane derivative, for example, includes aromatic amine.

The hole transport layer may contain a plurality of materials selected from the materials described above. The hole transport layer may contain a copolymer containing the plurality of materials described above. The polythiophene and the polythiophene derivative have excellent stereoregularity, and have comparatively high solubility with respect to a solvent.

The hole transport layer, for example, contain poly[N-9'-heptadecanyl-2,7-carbazole-alt-5,5-(4',7'-di-2-thienyl-2',1', 3'-benzothiadiazole)] (PCDTBT). Such a material is a copolymer including carbazole, benzothiadiazole, and thiophene.

In addition, the hole transport layer may contain a copolymer including a benzodithiophene (BDT) derivative and a thieno[3,2-b]thiophene derivative. The hole transport layer, for example, may contain poly[[4,8-bis[(2-ethyl hexyl)oxy] benzo[1,2-b:4,5-b']dithiophene-2,6-diyl][3-fluoro-2-[(2-ethyl hexyl)carbonyl]thieno[3,4-b]thiophene diyl]](PTB7). The hole transport layer, for example, may contain PTB7-Th (may also referred to as PCE10 or PBDTTT-EFT). In PTB7-Th, a thienyl group having weak electron-donating properties is introduced from an alkoxy group of PTB7.

In addition, the hole transport layer, for example, may contain a metal oxide. The metal oxide contained in the hole transport layer, for example, includes at least one selected from the group consisting of molybdenum oxide, vanadium oxide, nickel oxide, lithium oxide, calcium oxide, cesium oxide, magnesium oxide, and aluminum oxide.

The metal oxide contained in the hole transport layer, may contain a mixture of the plurality of materials described above. Such materials are inexpensive. The hole transport layer, for example, may contain thiocyanate (for example, copper thiocyanate and the like).

In addition, the hole transport layer, for example, may contain a conductive polymer (for example, polyethylene dioxythiophene and the like). The hole transport layer, for example, may contain a polythiophene-based polymer (PEDOT and the like) and other materials. For example, a suitable work function as the hole transport layer, can be obtained.

In addition, a forming method of the first interlayer 24 and the second interlayer 26, described above, is not limited. The first interlayer 24 and the second interlayer 26 may be formed according to a vacuum deposition method, a sputtering method, an ion plating method, a sol-gel method, a coating method, a plating method, or the like.

In addition, the thickness of the first interlayer 24 and the second interlayer 26 is not limited. The thickness of the first interlayer 24 and the second interlayer 26, for example, is greater than or equal to 5 nm and less than or equal to 100 nm.

Furthermore, the radiation detection element 10A may include only one of the first interlayer 24 and the second interlayer 26.

As described above, the radiation detection element 10A is identical to the radiation detection element 10 of the first embodiment, except that the first interlayer 24 is provided between the first conductive layer 14 and the organic semiconductor layer 16, and the second interlayer 26 is provided between the organic semiconductor layer 16 and the second conductive layer 18.

Accordingly, as with the radiation detection element 10 of the first embodiment, the radiation detection element 10A of this embodiment is capable of improving the detection sensitivity of the radiation L.

Third Embodiment

In this embodiment, an example of a radiation detector on which the radiation detection element 10 described in the above embodiment, is mounted, will be described.

Figure 4:
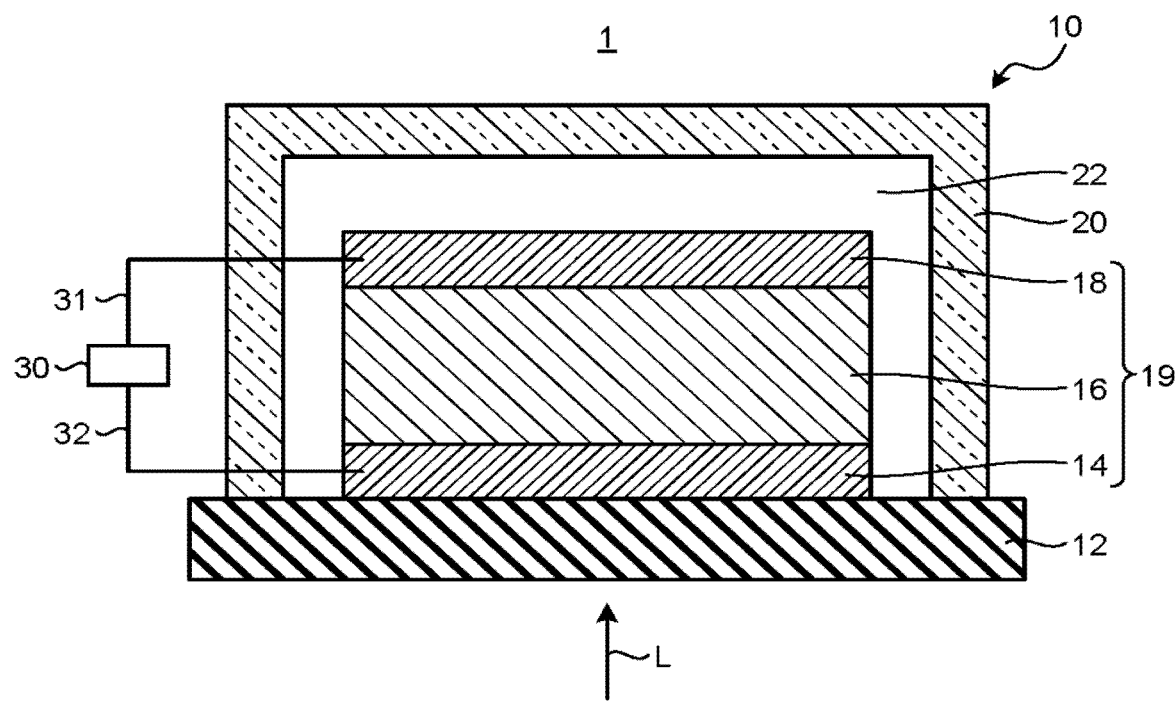
FIG. 4 is a schematic view of a radiation detector.

FIG. 4 is a schematic view illustrating an example of a radiation detector 1 of this embodiment.

The radiation detector 1 includes the radiation detection element 10 and a detection circuit unit 30. The radiation detection element 10 is the radiation detection element 10 of the first embodiment described above.

The detection circuit unit 30 detects the output signal output from the radiation detection element 10, and detects the radiation L. The detection circuit unit 30 is electrically connected to the second conductive layer 18 and the first conductive layer 14.

As described in the above embodiment, in a case where the radiation L is incident on the organic semiconductor layer 16, the excitons are generated in the organic semiconductor layer 16, and the movable charges (the electrons and the holes) are generated. The detection circuit unit 30 applies a bias voltage between the first conductive layer 14 and the second conductive layer 18, and the charges generated in the organic semiconductor layer 16 are taken out, and thus, an output signal according to the intensity of the incident radiation L is obtained. The detection circuit unit 30 detects the output signal, and thus, detects the radiation L.

FIG. 5 is a circuit diagram illustrating an example of the detection circuit unit 30. The detection circuit unit 30 includes a charge amplifier 35. Wiring 31 connected to the second conductive layer 18 (also refer to FIG. 4) is electrically connected to one of two input terminals of the charge amplifier 35. Wiring 32 connected to the first conductive layer 14 (also refer to FIG. 4) is electrically connected to the other of two input terminals of the charge amplifier 35. Then, a capacitance 36 is connected between a negative input of the charge amplifier 35 and an output terminal of the charge amplifier 35. For this reason, the detection circuit unit 30 is capable of obtaining an output signal according to charges generated between the first conductive layer 14 and the second conductive layer 18.

Furthermore, in the charge amplifier 35, resistance may be provided in parallel to the capacitance 36.

Furthermore, in this embodiment, a case where the radiation detector 1 includes the radiation detection element 10, will be described as an example. However, the radiation detector 1 may include the radiation detection element 10A (refer to FIG. 3), instead of the radiation detection element 10.

In addition, in the radiation detector 1, a plurality of radiation detection elements 10 may be two-dimensionally arranged along a two-dimensional plane orthogonal to a thickness direction of the radiation detection element 10 (in FIG. 1, refer to the direction of the arrow Z). In this case, a plurality of laminated bodies 19 (the laminated body of the first conductive layer 14, the organic semiconductor layer 16, and the second conductive layer 18) may be two-dimensionally arranged along the two-dimensional plane described above, and the plurality of laminated bodies 19 may be sealed with the sealing member 20.

EXAMPLES

Hereinafter, examples for describing the present invention in more detail, will be described, but the present invention is not limited to the examples. Furthermore, reference numerals correspond to the reference numerals described in the above embodiment.

Example 1

In Example 1, the radiation detection element 10A illustrated in FIG. 3 was produced. Here, the second interlayer 26 was not included.

First, a glass substrate was prepared as the support substrate 12. The first conductive layer 14 formed of ITO, having a thickness of 50 nm, was formed on the support substrate 12. Next, a solution of the hole transport layer was applied according to a spin coating method, and a heat treatment was performed at 230° C. for 20 minutes, and thus, the first interlayer 24 was formed. PB-4512D, manufactured by Nissan Chemical Industries, Ltd., was used as the material of the hole transport layer.

Next, the organic semiconductor solution 17 was applied onto the first interlayer 24, and thus, the organic semiconductor layer 16 was formed (the organic layer forming step 100).

The organic semiconductor solution 17 was prepared by mixing P3HT, 60PCBM, and a solvent. Furthermore, a ratio between P3HT and 60PCBM in the organic semiconductor solution 17, was 1:1 at a weight ratio. In addition, chlorobenzene was used as the solvent contained in the organic semiconductor solution 17. In addition, the total concentration of P3HT and 60PCBM in the organic semiconductor solution 17, was 4 weight %.

In addition, the organic semiconductor solution 17 was applied onto the first interlayer 24, according to drop casting. The thickness of the organic semiconductor layer 16 immediately after the organic semiconductor solution 17 was applied, was 25 μm.

Next, the organic semiconductor layer 16 formed according to the drop casting of the organic semiconductor solution 17, was left to stand for 10 hours in a normal temperature environment under nitrogen blow (the adjusting step 200).

Next, the second conductive layer 18 was formed on the organic semiconductor layer 16 (the second conductive layer forming step 102). The second conductive layer 18 was formed by depositing an Al film on the organic semiconductor layer 16.

Next, the laminated body 19 of the first conductive layer 14, the first interlayer 24, the organic semiconductor layer 16, and the second conductive layer 18, was sealed with the sealing member 20 (the sealing step 104). Sealing glass was used in the sealing member 20.

Next, the laminated body 19 of the first conductive layer 14, the first interlayer 24, the organic semiconductor layer 16, and the second conductive layer 18, was heated at 140° C. for 10 minutes (the heating step 106).

According to the steps described above, the radiation detection element 10 of Example 1 was produced.

Example 2

The radiation detection element 10 was produced by the same method as that of Example 1, except that in the organic layer forming step 100 of the producing method of the radiation detection element 10 of Example 1 described above, the organic semiconductor layer 16 formed according to the drop casting of the organic semiconductor solution 17, was left to stand for 8 hours in a normal temperature environment under nitrogen blow, and then, was left to stand for 60 minutes in a vacuum environment (the adjusting step 200).

Example 3

The radiation detection element 10 was produced by the same method as that of Example 1, except that in the organic layer forming step 100 of the producing method of the radiation detection element 10 of Example 1 described above, the organic semiconductor layer 16 formed according to the drop casting of the organic semiconductor solution 17, was left to stand for 3 hours in an environment of 60° C. under nitrogen blow (the adjusting step 200).

Example 4

The radiation detection element 10 was produced by the same method as that of Example 1, except that in the organic layer forming step 100 of the producing method of the radiation detection element 10 of Example 1 described above, the thickness of the organic semiconductor layer 16 immediately after the drop casting of the organic semiconductor solution 17 was subjected to the first interlayer 24, was adjusted to 50 μm (the adjusting step 200).

Example 5

The radiation detection element 10 was produced by the same method as that of Example 1, except that in the organic layer forming step 100 of the producing method of the radiation detection element 10 of Example 1 described above, except that the thickness of the organic semiconductor layer 16 immediately after the drop casting of the organic semiconductor solution 17 was subjected to the first interlayer 24, was adjusted to 50 μm (the adjusting step 200), and the organic semiconductor layer 16 formed according to the drop casting of the organic semiconductor solution 17, was left to stand for 4 hours in an environment of 50° C. under nitrogen blow, and then, was left to stand for 10 hours in a normal temperature environment, and was further left to stand for 1.5 hours in an environment of 45° C. (the adjusting step 200).

Comparative Example 1

In the producing method of the radiation detection element 10 of Example 1 described above, the second conductive layer 18 was formed on the organic semiconductor layer 16 (the second conductive layer forming step 102), and then, the laminated body 19 of the first conductive layer 14, the first interlayer 24, the organic semiconductor layer 16, and the second conductive layer 18, was heated at 140° C. for 10 minutes (the heating step).

Then, the laminated body 19 was sealed with the sealing member 20, after the heating step (the sealing step).

Thus, a comparative radiation detection element was produced by the same method as that of Example 1, except that the heating step was performed before the sealing step.

Comparative Example 2

A comparative radiation detection element was produced by the same method as that of Comparative Example 1, except that in the organic layer forming step 100 of the producing method of a comparative radiation detection element of Comparative Example 1 described above, the thickness of the organic semiconductor layer 16 immediately after the drop casting of the organic semiconductor solution 17 was subjected to the first interlayer 24, was adjusted to 50 μm.

Evaluation

In the radiation detection element 10 produced in Example 1 to Example 5 and the comparative radiation detection element produced in Comparative Example 1 and Comparative Example 2, described above, the solvent content of the organic semiconductor layer 16 was measured.

The solvent content of the organic semiconductor layer 16, was measured by a gas chromatograph mass spectrometer (GC/MS). Agilent Technologies 7890A GC System and Agilent Technologies 5975C inert MSD was used as a measurement device. In a gas chromatograph temperature-rising condition, retention was performed at 40° C. for 4 minutes, and then, temperature-rising was performed at 10° C./min, and at retention was performed 150° C. for 3 minutes. A result obtained by dividing a solvent weight measured by GC/MS, by the weight of the organic semiconductor layer 16, was obtained as the solvent content of the organic semiconductor layer 16. The measurement result of the amount of contained solvent was illustrated in FIG. 6.

As illustrated in FIG. 6, the solvent content of the organic semiconductor layer 16 in the comparative radiation detection element produced in Comparative Example 1 not including the adjusting step 200, was extremely small, compared to the radiation detection element 10 produced in the examples, and the solvent scarcely remained in the solvent organic semiconductor layer 16.

On the other hand, in the radiation detection element 10 produced in Example 1 to Example 5 including the adjusting step 200, the solvent content of the organic semiconductor layer 16 was larger than the solvent content of the organic semiconductor layer 16 in the comparative radiation detection element produced in Comparative Example 1.

In addition, in the comparative radiation detection element produced in Comparative Example 2, the solvent content of the organic semiconductor layer 16 was greater than the predetermined range described above.

For this reason, a result that the adjusting step 200 is important for adjusting the solvent content of the organic semiconductor layer 16 in the radiation detection element 10, was obtained.

In addition, in the radiation detection element 10 produced in Example 1 to Example 5 and the comparative radiation detection element produced in Comparative Example 1 and Comparative Example 2, described above, the bias voltage was applied between the first conductive layer 14 and the second conductive layer 18 in a state of not being irradiated with the radiation L, and a current value that is the output signal from the first conductive layer 14 and the second conductive layer 18, was measured. Furthermore, a voltage of 10 V to −200 V was applied as the bias voltage.

Then, the current value measured at the time of applying a bias voltage of −200 V, was derived as the value of the dark current of the radiation detection element 10 and the comparative radiation detection element.

Figure 7:
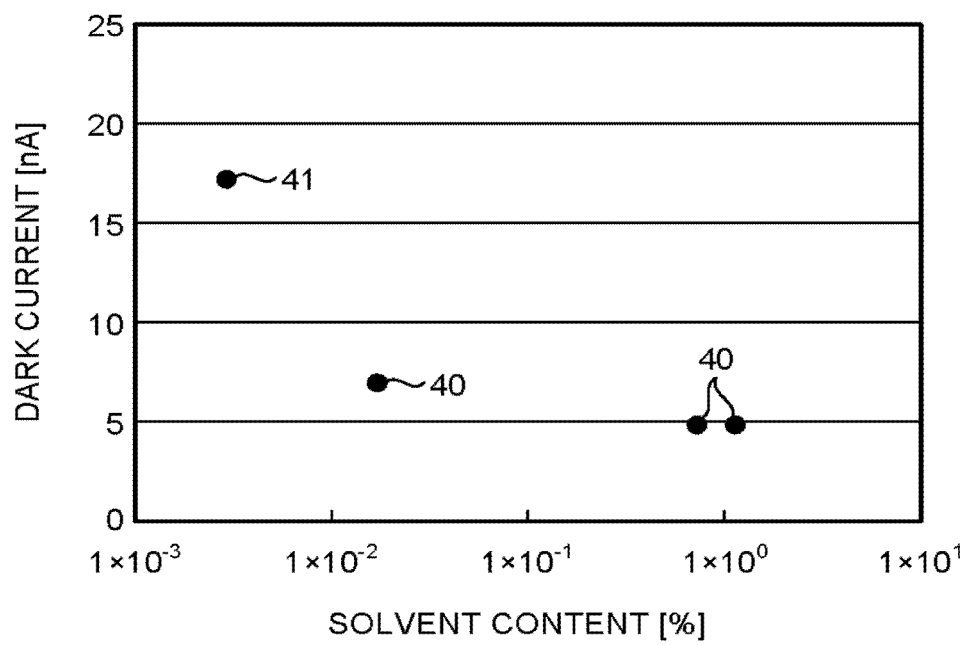
FIG. 7 is a diagram illustrating a relationship between the amount of contained solvent and the value of a dark current.
Figure 8:
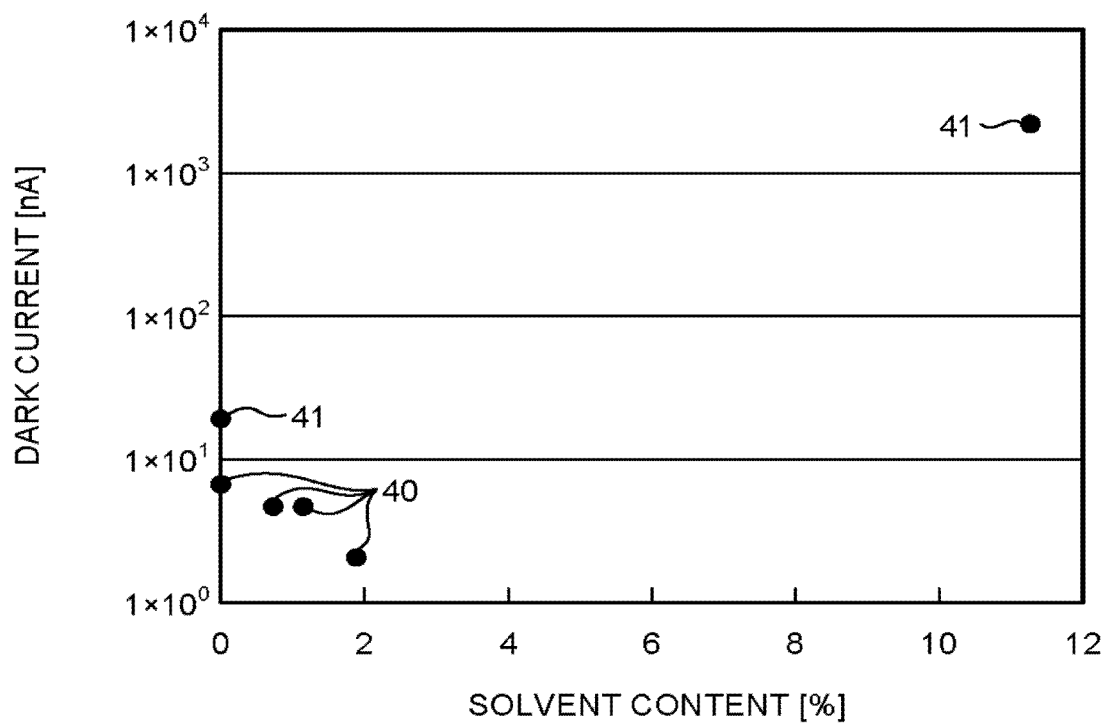
FIG. 8 is a diagram illustrating a relationship between the amount of contained solvent and the value of the dark current.

In each of the radiation detection elements 10 produced in Example 1 to Example 5 and the comparative radiation detection elements produced in Comparative Example 1 and Comparative Example 2, described above, a relationship between the solvent content of the organic semiconductor layer 16 and the value of the dark current, is illustrated in FIG. 7 and FIG. 8.

Furthermore, FIG. 7 illustrates a measurement result of the dark current when the solvent content (weight %) of the organic semiconductor layer 16 is in a range of $1.0 \times 10^{-3}$ to $1.0 \times 10^{1}$. In addition, FIG. 8 illustrates a measurement result of the dark current when the amount of contained solvent (weight %) is in a range of 0 to 12.

In FIG. 7 and FIG. 8, a plot 41 is a point indicating the relationship between the solvent content of the organic semiconductor layer 16 and the value of the dark current in each of the comparative radiation detection elements produced in Comparative Example 1 and Comparative Example 2. In addition, the plot 40 is a point indicating the relationship between the solvent content of the organic semiconductor layer 16 and the value of the dark current in each of the radiation detection elements 10 produced in Example 1 to Example 5.

As illustrated in FIG. 7 and FIG. 8, the dark current of the radiation detection element 10 produced in Example 1 to Example 5, in which the amount of contained solvent contained in the organic semiconductor layer 16 was in the predetermined range described above (the range of greater than 0.005 weight % and less than 11 weight %), was reduced, compared to the comparative radiation detection element of Comparative Example 1 and Comparative Example 2, in which the amount of contained solvent was out of the predetermined range.

For this reason, it was possible to confirm that the radiation detection element 10 of Example 1 to Example 5 was an element in which the detection sensitivity of the radiation L was improved, compared to the comparative radiation detection element of Comparative Example 1 and Comparative Example 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radiation detection element, comprising:
a support substrate;
a first conductive layer;
an organic semiconductor layer;
a second conductive layer; and
a sealing member of a laminated body of the first conductive layer, the organic semiconductor layer, and the second conductive layer,
wherein a solvent content of the organic semiconductor layer is in a range of greater than 0.005 weight % and less than 11 weight %.

2. The radiation detection element according to claim 1, wherein the range of the solvent content of the organic semiconductor layer is a range of greater than or equal to 0.01 weight % and less than or equal to 2.5 weight %.

3. The radiation detection element according to claim 1, wherein a thickness of the organic semiconductor layer is greater than or equal to 1 μm.

4. The radiation detection element according to claim 1, wherein the thickness of the organic semiconductor layer is greater than or equal to 10 μm and less than or equal to 1000 μm.

5. The radiation detection element according to claim 1, wherein the organic semiconductor layer contains a first conductivity type first compound and a second conductivity type second compound.

6. The radiation detection element according to claim 5, wherein the first compound includes at least one selected from the group consisting of poly(3-methyl thiophene), poly(3-butyl thiophene), poly(3-hexyl thiophene), poly (3-octyl thiophene), poly(3-decyl thiophene), poly(3-dodecyl thiophene), poly(3-phenyl thiophene), poly(3-(p-alkyl phenyl thiophene)), poly(3-butyl isothionaphthene), poly(3-hexyl isothionaphthene), poly(3-octyl isothionaphthene), poly(3-decyl isothionaphthene), and polyethylene dioxythiophene.

7. The radiation detection element according to claim 5, wherein the first compound includes poly(3-hexyl thiophene).

8. The radiation detection element according to claim 5, wherein the second compound includes at least one selected from the group consisting of $C_{60}H_{36}$, $C_{70}H_{36}$, [6,6]-phenyl-$C_{61}$-butyric acid methyl ester, [6,6]-phenyl-$C_{71}$-butyric acid methyl ester, an indene-$C_{60}$-bis-adduct, a dihydronaphthyl-$C_{60}$-bis-adduct, and a dihydronaphthyl-$C_{70}$-bis-adduct.

9. The radiation detection element according to claim 5, wherein the second compound includes [6,6]-phenyl-C71-butyric acid methyl ester.

* * * * *